United States Patent
Paetzoldt et al.

(10) Patent No.: US 9,462,706 B2
(45) Date of Patent: Oct. 4, 2016

(54) DEVICE FOR A SYSTEM FOR TRAFFIC MONITORING OF VEHICLES IN ROAD TRAFFIC

(71) Applicant: JENOPTIK Robot GmbH, Monheim am Rhein (DE)

(72) Inventors: Volker Paetzoldt, Heide (DE); Thomas Buenger, Lohe-Rickelshof (DE); Stephan Maserski, Dortmund (DE); Joerg Friessner, Leverkusen (DE)

(73) Assignee: JENOPTIK Robot GmbH, Monheim am Rhein (DE)

( * ) Notice: Subject to any disclaimer, the term of this patent is extended or adjusted under 35 U.S.C. 154(b) by 90 days.

(21) Appl. No.: 14/259,918

(22) Filed: Apr. 23, 2014

(65) Prior Publication Data

US 2014/0312749 A1 Oct. 23, 2014

(30) Foreign Application Priority Data

Apr. 23, 2013 (DE) .................. 10 2013 006 942

(51) Int. Cl.
*G08G 1/017* (2006.01)
*H05K 5/00* (2006.01)
*G08G 1/054* (2006.01)
*F16M 11/08* (2006.01)

(52) U.S. Cl.
CPC ............. *H05K 5/00* (2013.01); *F16M 11/08* (2013.01); *G08G 1/054* (2013.01); *G08G 1/0175* (2013.01)

(58) Field of Classification Search
CPC ........................................... H05K 5/00
USPC ............................... 340/933, 937; 312/223.1
See application file for complete search history.

(56) References Cited

U.S. PATENT DOCUMENTS

| | | | | |
|---|---|---|---|---|
| 4,788,441 A | * | 11/1988 | Laskowski | G01C 15/002 250/559.07 |
| 5,221,956 A | * | 6/1993 | Patterson | G01S 17/42 356/28 |
| 5,231,393 A | * | 7/1993 | Strickland | G01P 1/08 340/905 |
| 5,850,579 A | * | 12/1998 | Melby | F16M 11/10 396/427 |
| 6,095,345 A | * | 8/2000 | Gibbons | G06F 1/183 211/190 |
| 6,204,778 B1 | * | 3/2001 | Bergan | G08G 1/075 340/905 |

FOREIGN PATENT DOCUMENTS

| | | |
|---|---|---|
| AU | 780179 B2 | 3/2005 |
| DE | 100 17 575 A1 | 10/2001 |
| DE | 20 2010 009 315 U1 | 11/2010 |
| EP | 1 148 457 A2 | 10/2001 |
| EP | 1 182 759 A2 | 2/2002 |
| FR | 2 962 245 A1 | 1/2012 |
| JP | 2001-155291 A | 6/2001 |

* cited by examiner

*Primary Examiner* — Eric M Blount
(74) *Attorney, Agent, or Firm* — Muncy, Geissler, Olds & Lowe, P.C.

(57) ABSTRACT

A device for a system for traffic monitoring of vehicles in road traffic, the device having a first mounting frame and a second mounting frame, which can be secured relative to each other by inner fixing elements. At least the first mounting frame has a cylindrical, especially cuboidal, shape. At least one device for recording a traffic situation can be disposed or is disposed in the first mounting frame and wherein at least the first mounting frame is accessible from four sides.

11 Claims, 5 Drawing Sheets

DEVICE FOR A SYSTEM FOR TRAFFIC MONITORING OF VEHICLES IN ROAD TRAFFIC

This nonprovisional application claims priority under 35 U.S.C. §119(a) to German Patent Application No. 10 2013 006 942.4, which was filed in Germany on Apr. 23, 2013, and which is herein incorporated by reference.

BACKGROUND OF THE INVENTION

1. Field of the Invention

The present invention relates to a device for a system for traffic monitoring of vehicles in road traffic.

2. Description of the Background Art

In traffic monitoring technology, devices that transmit and/or receive radiation, are disposed together with lighting devices (also referred to here as equipment modules) in a device that is mounted in a stationary state in a region beside at least one carriageway. Besides the stationary devices for traffic monitoring, there are also devices that are installed in vehicles or that can be operated by traffic monitoring staff. In these cases a vehicle or suitable staff must always be kept available for monitoring. Road users notice vehicles parked in unusual places. With other traffic monitoring devices, radar equipment, cameras, flash units and operating devices are placed separately. That requires accurate orientation of the individual parts relative to each other and in relation to the carriageway to be monitored prior to use, not to mention an increased need for staff. The devices can thereby be exposed to weather in an undesirable manner. Traffic monitoring devices with a camera and a flash unit in a cuboid container, which comprises windows for the camera and the flash unit, are known. Because such traffic monitoring devices can be heavy and unwieldy, several persons are needed to set up the traffic monitoring devices and for unloading from a vehicle and loading into the vehicle.

A device for a stationary system for speed monitoring is disclosed in utility model document DE 20 2010 009 315 U1. A traffic monitoring device is also disclosed in patent application DE 10017575 A1.

SUMMARY OF THE INVENTION

It is therefore an object of the present invention to provide a device for a system for traffic monitoring of vehicles in road traffic With a quasi-stationary and at the same time transportable traffic monitoring device, advantages of a stationary solution and a mobile solution can be combined with each other. If, furthermore, the traffic monitoring device is of modular design, it can be simply and inexpensively adapted to varying tasks. A modular solution thereby also enables the use of different materials in order to design the overall solution of a device for a system for traffic monitoring of vehicles in road traffic to be light yet robust.

A device for a system for traffic monitoring of vehicles in road traffic is presented here, wherein the device comprises a first mounting frame and a second mounting frame, which can be secured or are secured relative to each other by inner fixing elements, wherein at least the first mounting frame has a cylindrical, especially cuboidal, shape, wherein at least one device for recording a traffic situation can be disposed or is disposed in the first mounting frame, characterized in that at least the first mounting frame is accessible from four sides.

A system for traffic monitoring of vehicles in road traffic can be understood to mean a system that is suitable for performing speed monitoring, red light monitoring, combined red light and speed monitoring or other monitoring of traffic violations. The device for the system for traffic monitoring can thereby be implemented as a stationary, quasi-stationary or alternatively as a mobile device for a system for traffic monitoring. The system for traffic monitoring comprises at least one device for recording a traffic situation, which is disposed in the first mounting frame of the device. A device for recording a traffic situation can e.g. be understood to mean a radar sensor or lidar device, a camera, a speed measurement device, an optical, optoelectrical or electromagnetic measurement or recording devices or similar or a combination of the above known elements. In an embodiment, the at least one device for recording a traffic situation can be inserted into a drawer in the mounting frame. At least the first mounting frame can be accessible from four sides. Thus the first mounting frame can be accessible e.g. in the mounted state from all directions in a plane or alternatively at least from four mutually perpendicular directions in a plane. Thus in an embodiment the first mounting frame can comprise four posts oriented with respect to each other, which for this purpose comprise vertical shelves or rails for inserting a drawer. A device for a system for traffic monitoring can e.g. be disposed beside a carriageway of a road, between two carriageways of a road or alternatively above a carriageway of a road. A device for a system for traffic monitoring can be in a predetermined geometric relationship to at least one carriageway of a road.

Furthermore, the second mounting frame can be fixable on the side opposite the first mounting frame to a base plate mounted on a measurement station. The base plate can thereby be oriented in relation to the measurement station within a tolerance range. The tolerance range can be ±5°. In one advantageous embodiment, the tolerance range can be ±25°. The angle of the base plate to the measurement station can be oriented parallel to a plane and at the same time or alternatively perpendicularly to the carriageway. A measurement station can thereby be understood to be a base that is fixedly disposed in a region adjacent to the carriageway. The base plate can be a mounting plate that can be joined or is joined by fixing elements, such as e.g. screws, pins or bolts, to the measurement station and at the same time or alternatively to the second mounting frame. The base plate can thereby be provided to be fixedly joined to the measurement station. The base plate can thereby be flexibly joined to the second mounting frame as required, if the device for a system for traffic monitoring of vehicles in road traffic is to be anchored on the base plate in a quasi-stationary manner. The device for a system for traffic monitoring of vehicles in road traffic can also be simply released from the base plate and moved to another destination. Advantageously, a square base plate that can be fixedly screwed down and remains in place is mounted on a measurement station. A cover for protection of the base plate can thereby be disposed on the base plate if no device or no second mounting frame or second housing is mounted there.

The second mounting frame can be mounted on the base plate rotated by a whole number multiple of 90° within a tolerance range. Thus in an embodiment the mounting frame can be mounted rotated by 90 degrees or 180 degrees or 270 degrees within a tolerance range. The tolerance range can thereby be from a few degrees up to ±25 degrees. In order to be able to mount the mounting frame on the base plate rotated by a multiple (which also includes the factor 1) of 90 degrees, the base plate can have a square and at the same time an axially symmetrical shape. This enables the device to be simply converted from monitoring the oncoming traffic to monitoring the departing traffic, without requiring a new base plate or a new or different mounting plate. This enables a flexible monitoring system to be advantageously provided.

In an embodiment the device comprises at least one housing. The housing can be fitted with at least one door, especially wherein the first and/or second mounting frame can be disposed or is/are disposed in the housing. The housing can enclose the first mounting frame. Alternatively, the housing can enclose the second mounting frame. In an embodiment the housing encloses the first mounting frame and at the same time the second mounting frame. It is also advantageous if the first mounting frame comprises a first housing and the second mounting frame comprises a second housing different from the first housing. In one advantageous embodiment, the first mounting frame and the second mounting frame each comprises a dedicated housing. With one housing the system for traffic monitoring can be simply and efficiently protected, e.g. against weather effects or vandalism.

In an embodiment the housing comprises at least one door whereas the door can be open (open state) or can be closed (closed state). In an open state at least the first mounting frame is accessible from four sides.

The housing can also comprise at least one hinged door. In an embodiment the housing can comprise at least two hinged doors. If the housing comprises two hinged doors, they can be joined at a common hinge. Two hinged doors can completely enclose at least one mounting frame. A hinge of the at least one hinged door can be disposed on one edge or a stop corner of the housing or of the mounting frame. In particular, two hinged doors can completely enclose the first mounting frame. The device for a system for traffic monitoring thus has a first closed state, in which the two hinged doors completely enclose the mounting frame, and a second open state, in which the first mounting frame is accessible from four sides.

According to an embodiment of the present invention, the housing comprises at least one window on each of three sides of the housing. One window can be designed such that radiation emitting and/or receiving device modules, such as e.g. optical, optoelectrical or electromagnetic measurement or recording devices, send and/or receive electromagnetic radiation through the window. In particular, the device for recording can comprise at least one sub-element that is designed for sending or receiving electromagnetic radiation through the at least one window. Devices disposed within the housing can thus perform traffic monitoring outside of the housing through the window. If the device for a system for traffic monitoring comprises windows on at least two sides, especially on three sides, of the first housing, then the device or the housing of the device can optionally be used either for approaching traffic or for departing traffic.

Furthermore, the housing can have a specific protection class. Furthermore, the housing can have a specific type of protection. A specific protection class or type of protection can especially be achieved by a choice or specification of a material of the housing. The type of protection of the housing can protect the system for traffic monitoring against different ambient conditions. The housing can thus be designed to be bulletproof in an embodiment. The housing can thus be capable of protecting the system for traffic monitoring against bullets of a certain type or caliber.

The second mounting frame, or a device that is disposed in the second mounting frame, can be designed as an autonomous energy supply unit. Alternatively, an autonomous energy supply unit can be disposed in the second mounting frame. The second mounting frame can thus be designed such that the accumulator or battery mounted therein is changed whilst the second mounting frame remains on the device or the entire mounting frame including the accumulator or battery is used and changed as a battery pack. The second mounting frame or a device in the second mounting frame can also be used for providing externally delivered energy. If the second mounting frame provides an autonomous energy supply unit, it is only required to connect a supply line to the first mounting frame to a line of the autonomous energy supply unit to commission the device for a system for traffic monitoring of vehicles in road traffic.

If the device for a system for traffic monitoring of vehicles comprises inner fixing elements for joining the base plate to the second mounting frame and at the same time or alternatively for joining the second mounting frame to the first mounting frame, then the device is advantageously theft-proof. Because the base plate can be oriented in relation to the measurement station, only a one-time orientation by qualified staff is necessary, and if the quasi-stationary device is set up at said location, the combination of a fixedly mounted base plate with two modular housings results in a quasi-stationary transportable device for a system for traffic monitoring. The advantages of an accurately adjusted, stationary device can thus be combined with the advantages of a transportable device. The modular concept enables a flexible decision to be made at any time between a battery change, a battery pack change and mains supply, wherein a mixed mode is also possible. A modular concept, as described above, additionally enables the interior, that is e.g. the mounting frame, to be made of light and inexpensive aluminum and the outer casing to be adapted to the protection classes or the design concept, e.g. by the use of stainless steel. By virtue of its multi-part nature, the housing can be constructed as an entire system by two persons without a crane or by one person with a crane.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
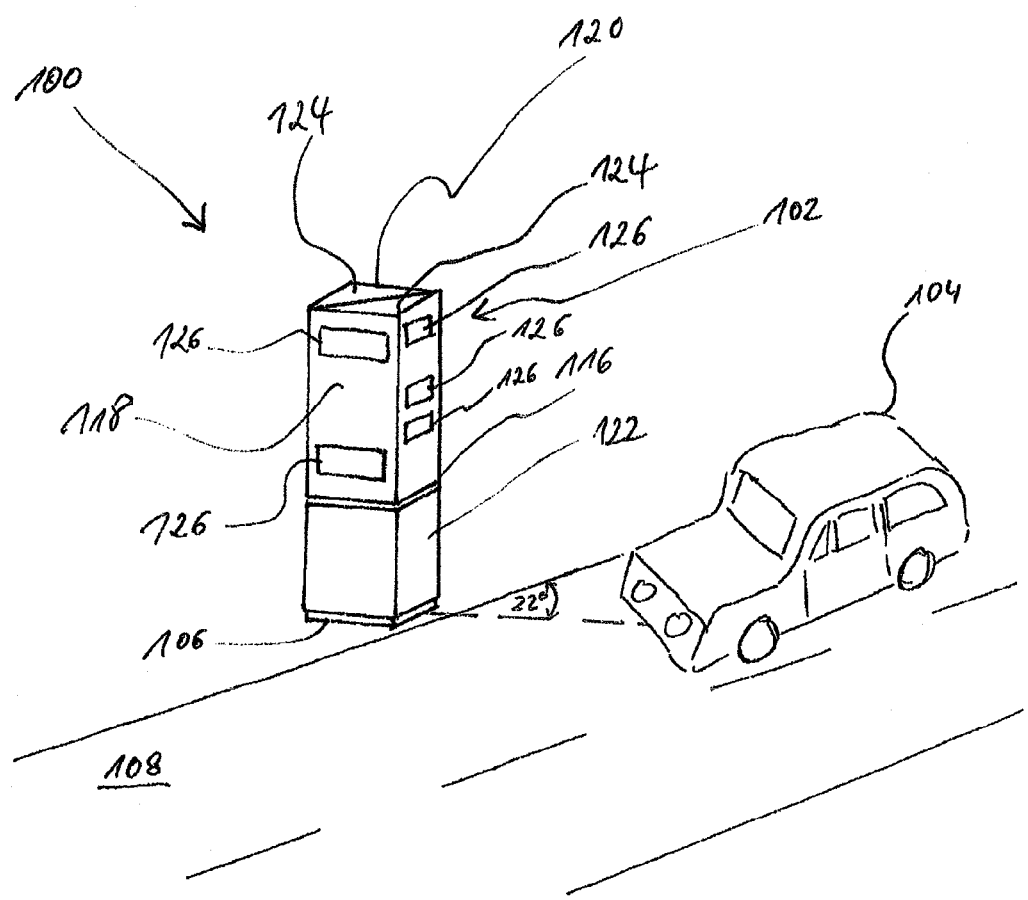
FIG. 1 shows an illustration of a device for a system for traffic monitoring of vehicles in road traffic according to an exemplary embodiment of the present invention on a measurement station beside a road.

FIG. 1 shows a device 100 for a system 102 for traffic monitoring of vehicles 104 in road traffic on a measurement station 106 beside a road 108 according to an exemplary embodiment of the present invention. Beside the road 108 a base plate, which is not shown in FIG. 1, is disposed on the measurement station 106. The base plate can be joined to a base, e.g. of concrete. The device 100 for a system 102 for traffic monitoring of vehicles 104 in road traffic is disposed on the base plate. In FIG. 1 the device 100 comprises a (not shown) first mounting frame and a second (not shown) mounting frame, which are joined to (also not shown) inner fixing elements. This also applies to the connection of the second mounting frame to the base plate. In the present exemplary embodiment, the first mounting frame and the second mounting frame comprise square footprints. The second mounting frame is connected by the (not shown) base plate to the measurement station 106, i.e. the second mounting frame rests on the base. The first mounting frame 110 is disposed on the side of the second mounting frame facing away from the base. Starting from the square footprint of the mounting frame, the mounting frames extend cylindrically and thus each is of cuboidal shape. A (not shown) device for recording a traffic situation is disposed in the first mounting frame.

In the exemplary embodiment illustrated in FIG. 1, the device 100 for a system 102 for traffic monitoring of vehicles 104 comprises a housing 116. The housing 116 comprises at least one (not shown) door. In said special exemplary embodiment, the housing 116 is in two parts. The first mounting frame thus comprises a first housing 120 and the second mounting frame comprises a second housing 122.

The door 118 associated with the first housing 120 is a hinged door 124 in the exemplary embodiment shown in FIG. 1. The first housing 120, as illustrated in one of the following exemplary embodiments, can thereby comprise two hinged doors 124, which e.g. are opened by a common hinge on an outer edge of the first mounting frame. With the first housing 120, five windows 126 can be seen, wherein three windows 126 facing the road are disposed in the closed housing part and two further windows 126 are disposed in the hinged door 124 offset relative thereto by 90°. The device 100 can thereby comprise at least one further window 126 on a side facing away from the observer, especially on the diametrically opposite side with the two windows.

Depending on the exemplary embodiment, the housing 116, or the first housing 120 and at the same time or alternatively the second housing 122, can have a specific protection class. The first housing 120 can thereby have a different protection class from the second housing 122. A specific protection class can especially be achieved by the selection of a particularly advantageous material for the housing. Thus, in one exemplary embodiment, the housing 116, or the first housing 120 and at the same time or alternatively the second housing 122, can be designed to be bulletproof.

The first mounting frame can be designed such that it is accessible from four sides, wherein the four sides can be the sides adjacent to the side facing the second mounting frame.

Figure 2:
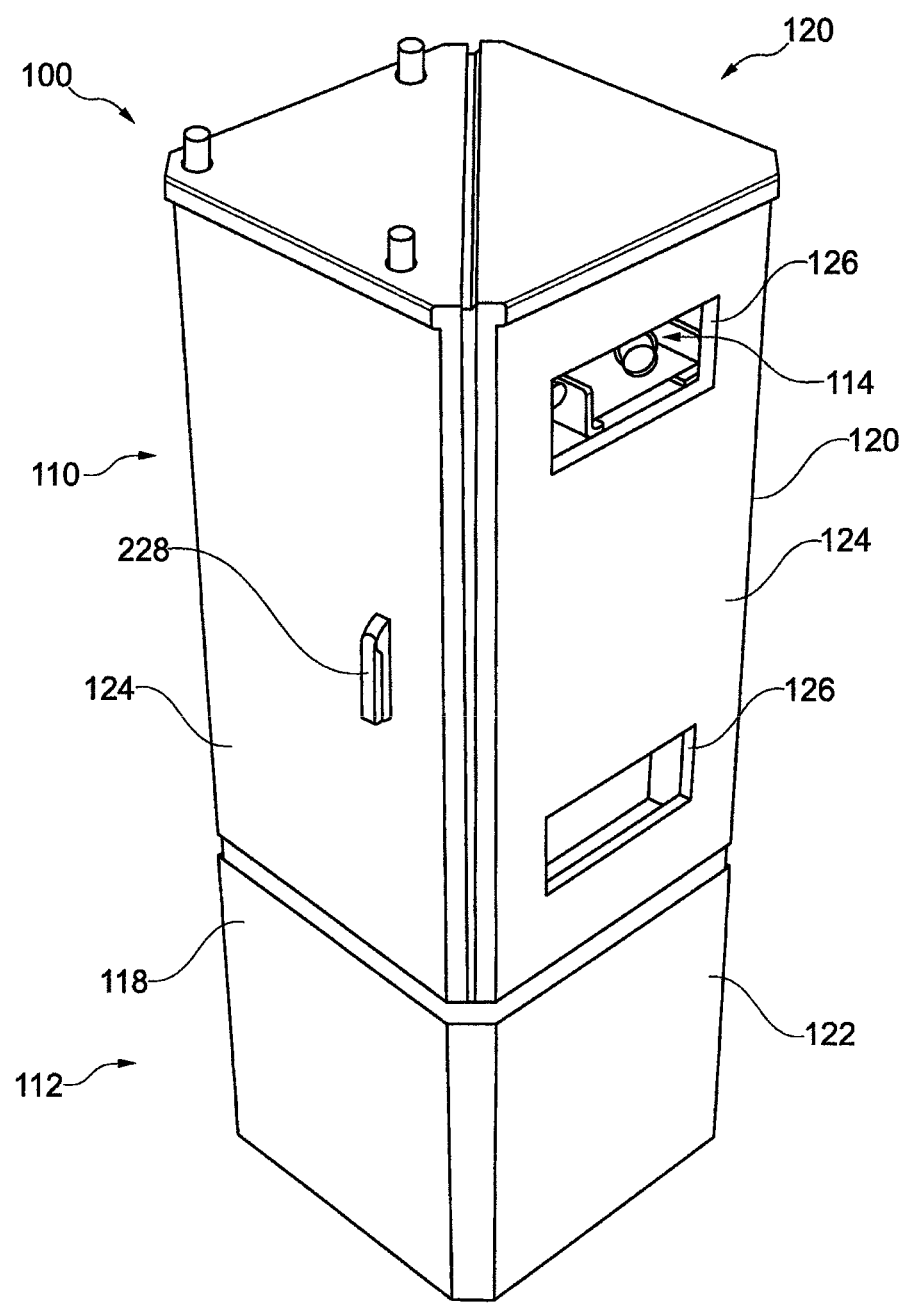
FIG. 2 shows an illustration of a device for a system for traffic monitoring according to an exemplary embodiment of the present invention in a closed state.

FIG. 2 shows a device 100 for a system 102 for traffic monitoring in a closed state according to an exemplary embodiment of the present invention. The device 100 can be the device 100 for a system 102 for traffic monitoring already described in FIG. 1. The device 100 is illustrated in a closed state. The two mounting frames are covered by the housings associated therewith, i.e. the first housing 120 and the second housing 122. The first housing 120 comprises two hinged doors 124. One of the two hinged doors 124 comprises windows on two sides, as illustrated in FIG. 1, of which one side has two windows 126. Within the device 100 a photographic device for recording a traffic situation is disposed on the (not shown) first mounting frame such that the device for recording a traffic situation, being directed outwards through the one window 126, can monitor the traffic. A door handle 228 is disposed on the hinged door 124, which has no window 126. The door handle 228 can be provided with a lock, which is designed such that when the door handle 228 is operated and thus the associated lock is operated the two hinged doors 124 of the first housing 120 are released and can thus pivot outwards. In one exemplary embodiment the two hinged doors 124 can thereby comprise a common hinge.

In an exemplary embodiment, the device 100 comprises a two-part housing. The device 100 or the two-part housing of the device 100 can be attached to the measurement station 106 via a base plate. In one exemplary embodiment, the device 114 for photographic recording of a traffic situation can be a still camera and also a video camera, which is positioned behind the upper window 126. An illumination device 117, especially a flashlight, is positioned behind the lower window. In one exemplary embodiment, the lower part of the housing, i.e. the second housing 112, is secured both with respect to the base plate and also with respect to the upper part, i.e. to the first mounting frame or to the first housing 120, with inner fixing elements, such as e.g. screws, bolts with split pins, a quick release device or similar. The remote side diametrically opposite the side with the door handle 228 comprises three windows 126, behind which a device for recording the traffic situation is positioned. Said device for recording the traffic situation comprises a wave beam based sensing system, e.g. a sensing system that enables analysis of a beam of an electromagnetic wave, a high-resolution camera and an illumination device, especially a flashlight. The side of the housing with the sensing system is the side that faces the front of the vehicle during metrological monitoring of approaching traffic, especially directed into the traffic at 22° to the direction of the carriageways and opposite to the direction of travel, and during metrological monitoring of departing traffic faces the rear of the vehicle, especially directed into the traffic at 22° to the direction of travel and with the direction of travel.

In an exemplary embodiment, the housing 116 (120, 122) can be easily adapted to different protection classes or design concepts by varying the material of the hinged doors 124 and the casing 122 of the battery pack, e.g. in order to implement the housing in a bulletproof form.

Figure 3:
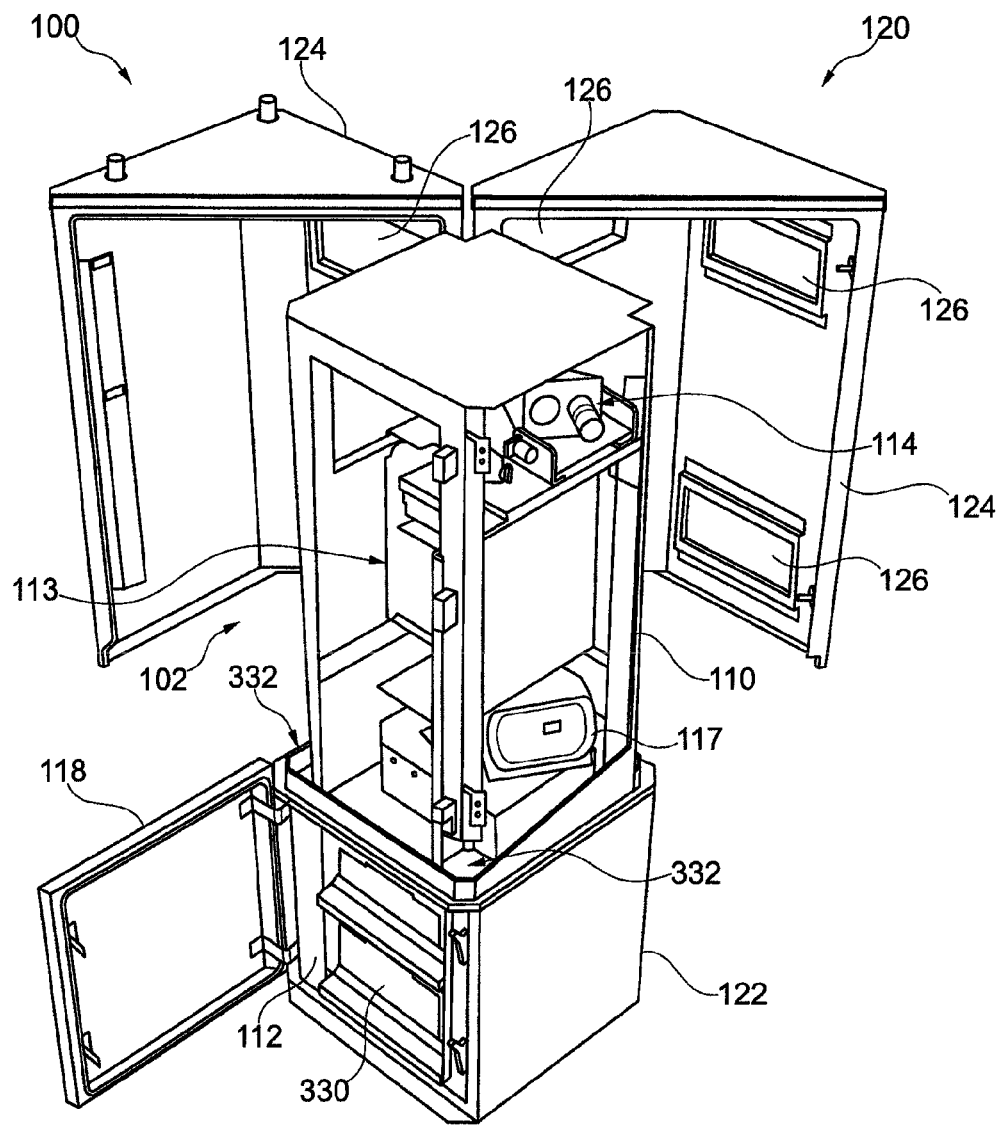
FIG. 3 shows an illustration of a device for a system for traffic monitoring according to an exemplary embodiment of the present invention in an open state.

FIG. 3 shows a device 100 for a system 102 for traffic monitoring in an open state according to an exemplary embodiment of the present invention. The device 100 can be the device 100 described in FIG. 1 or alternatively the device 100 described in FIG. 2 for a system 102 for traffic monitoring. In the exemplary embodiment shown, the two hinged doors 124 of the first housing 120 are open. The two hinged doors 124 abut one edge of the first mounting frame 110. The hinged doors 124 comprise windows 126, wherein in a closed state these are disposed on three different sides of the first housing 120. The one hinged door 124 thus comprises at least one window 126 on one panel and the other hinged door comprises two windows 126 on one panel and at least three windows 126 on the other panel. The second housing 122 comprises a door 118. An autonomous energy supply 330 is disposed in the second mounting frame 112 enclosed by the second housing 122. In an alternative (not shown) exemplary embodiment, an alternative mains connection to the power supply is led via the second mounting frame 112 or the second housing 122.

The second mounting frame 112 is joined to the first mounting frame 110 via inner fixing elements 332. The inner fixing elements 332 can be screws, bolts with or without split pins, a quick release device or similar. At least two devices 113 and 114, especially three devices, are disposed in the first mounting frame 110, wherein the third device is a video camera, which is disposed above the device 113 behind the device 114 so as not to be visible and which is directed through the window 126 of the hinged door, which only has one window, wherein the device 113 for recording the traffic situation comprises a wave beam based sensing system, e.g. a sensing system that enables the analysis of a beam of an electromagnetic wave, a high-resolution camera and an illumination device, especially a flashlight, and is disposed such that it is directed towards the traffic for recording a traffic situation. If the system 102 is used for traffic monitoring of the approaching traffic and the front of a vehicle is photographed with the photographic monitoring device of the device 113, in addition the rear of the vehicle is photographed with the photographic recording device 114. If the system 102 is used for traffic monitoring of the departing traffic and the rear of the vehicle is photographed with the photographic monitoring device of the device 113, in addition the approaching vehicles are recorded with the video camera. The devices 113, 114 and the video camera for recording a traffic situation are components of the system 102 for traffic monitoring.

In an exemplary embodiment, the complete housing is divided, i.e. the second mounting frame 112 and the second housing 122 are designed such that it can be used as a battery pack; for electrical connection it is only necessary to connect the supply line of the upper part, i.e. at least of the device 113 for recording a traffic situation, which is disposed in the first mounting frame 110, to the line of the lower part, i.e. to the line of the autonomous energy supply 330. The video camera and the other device 114 can preferably be supplied with energy via the device 113.

Figure 4:
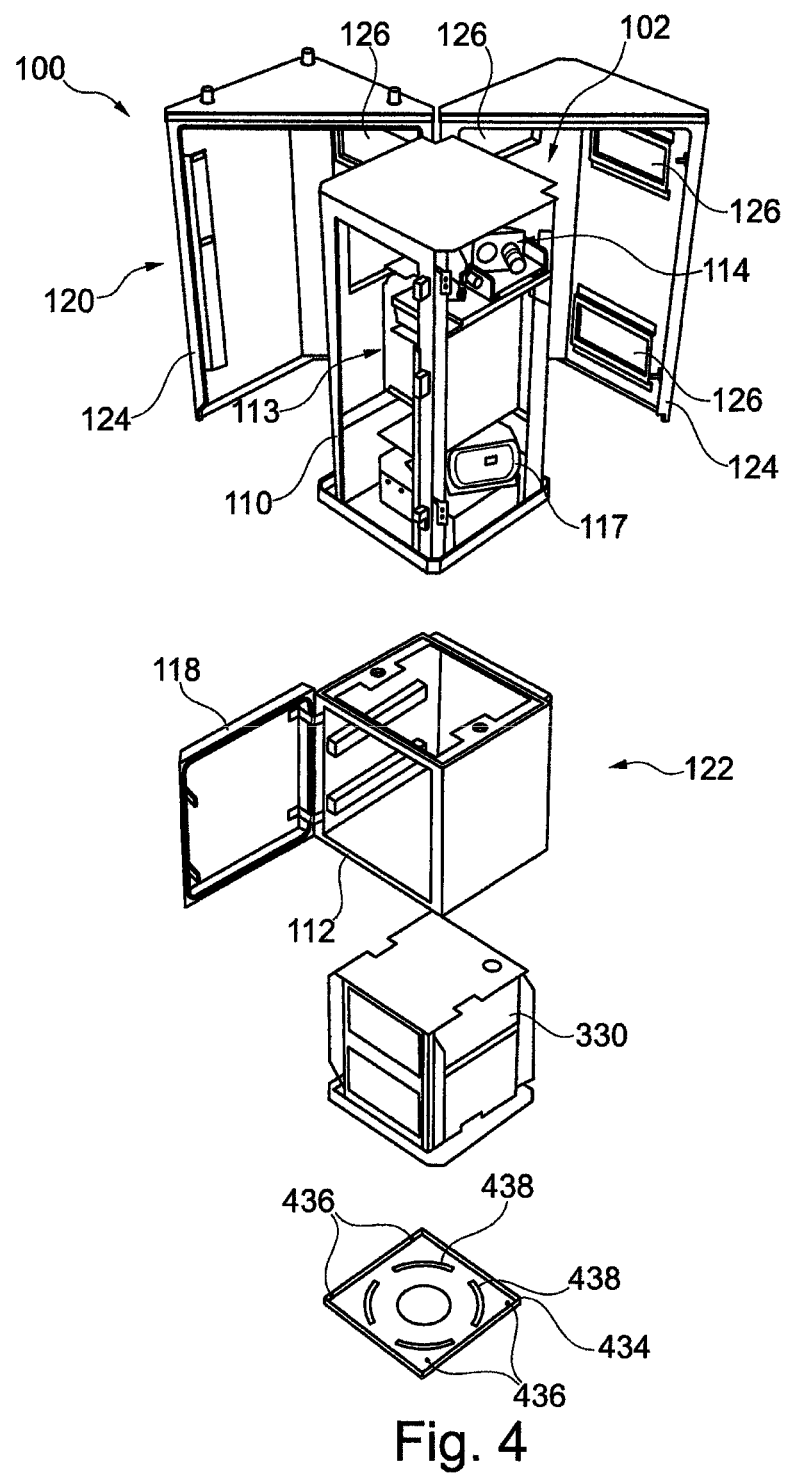
FIG. 4 shows an exploded illustration of a device for a system for traffic monitoring according to an exemplary embodiment of the present invention.

FIG. 4 shows a device 100 for a system 102 for traffic monitoring in an exploded illustration according to an exemplary embodiment of the present invention. The device 100 shown in FIG. 4 can be an exemplary embodiment of the device 100 for a system 102 for traffic monitoring shown in FIGS. 1 to 3. The individual elements of the device 100 can be identified well using the exploded illustration in FIG. 4. A first mounting frame 110 is oriented towards a second mounting frame 112, wherein a base plate 434 is disposed on the side of the second mounting frame 112 facing away from the first mounting frame 110. In the exploded illustration an autonomous energy supply 330 is shown between the base plate 434 and the second mounting frame 112. The autonomous energy supply 330 can be an accumulator or alternatively a battery. The autonomous energy supply 330 is provided to be disposed within the second mounting frame 112. At least two devices 113 and 114, especially three devices, for recording a traffic situation are disposed in the first mounting frame 110, wherein the third device is a video camera. The at least two devices 113 and 114 for recording a traffic situation are part of a system 102 for traffic monitoring. The second mounting frame 112 comprises a second housing 122, wherein the second housing comprises a door 118 on one side. The first mounting frame 110 comprises a first housing 120, wherein the first housing 120 is essentially formed by two hinged doors 124. A plurality of windows 126 are formed in the hinged doors 124, as already described in the description for FIG. 3.

In the exemplary embodiment shown in FIG. 4, the base plate 434 comprises an essentially square footprint. At least four holes 436 are formed at the edges of the base plate 434. The holes 436 are designed to join the base plate 434 to the second mounting frame 112. The second mounting frame 112 can be fixed on the side opposite the first mounting frame 110 to a base plate 434 mounted on a measurement station 106. The base plate 434 can thereby be oriented in relation to the measurement station 106 within a tolerance range. For this purpose, the base plate 434 comprises four apertures 438 in the form of circle segments. In the region of the apertures 438 the base plate 434 can be fixed with suitable fixing elements onto a base of the measurement station 106. The base plate 434 can thus be oriented to the base, e.g. in a range of ±25°. In this case the described tolerance range is ±25°. In other exemplary embodiments the tolerance range for orienting the base plate 434 in relation to the base can be e.g. ±5°, ±10°, ±15°, ±20° or ±30°.

If, as in the exemplary embodiment shown in FIG. 4, the base plate 434 essentially has a square shape, and the footprint of the second mounting element 112 has for this purpose a corresponding square shape, then the second mounting frame 112 can be mounted on the base plate rotated by a multiple of 90° within a tolerance range. The second mounting frame can thus be fixed onto the base plate rotated by 90°, 180° or 270°. The tolerance range can thereby be less than ±5°.

As already in the exemplary embodiment shown in FIG. 3, an autonomous energy supply 330 can be disposed in the second mounting frame 112. In an alternative exemplary embodiment, the second mounting frame 112 is designed as an autonomous energy supply 330.

Figure 5:
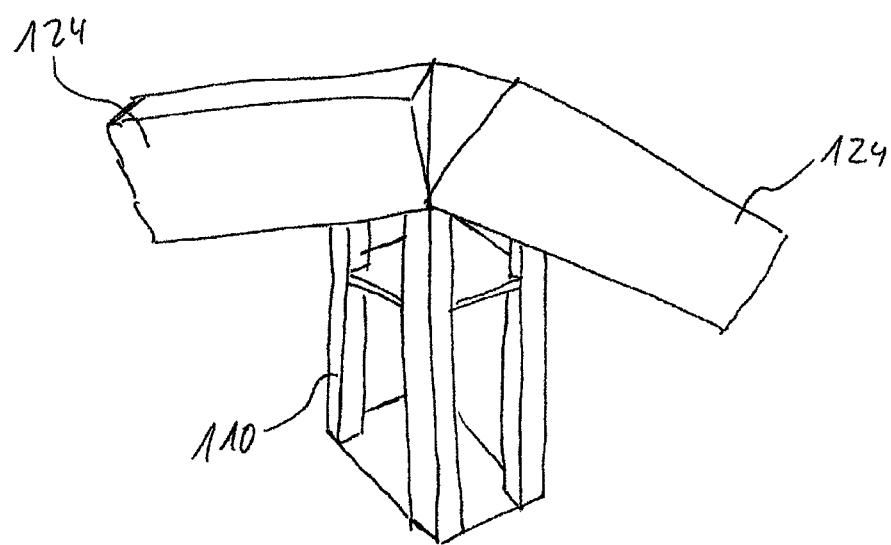
FIG. 5 shows an illustration of a device for a system for traffic monitoring with hinged doors according to an exemplary embodiment of the present invention.

FIG. 5 shows a device 100 for a system for traffic monitoring with hinged doors 124 according to an exemplary embodiment of the present invention. The device 100 for a system for traffic monitoring can be an exemplary embodiment of a device 100 for a system for traffic monitoring already described in FIG. 1 to FIG. 4. In comparison to the device 100 described in FIG. 4, the two hinged doors 124 do not butt against a lateral edge of the first mounting frame 110, but the two hinged doors 124 are disposed on a diagonal on the end face of the first mounting frame 110 facing away from the second mounting frame 112. In this way the two hinged doors 124 each pivot upwards in the mounted state.

Figure 6:
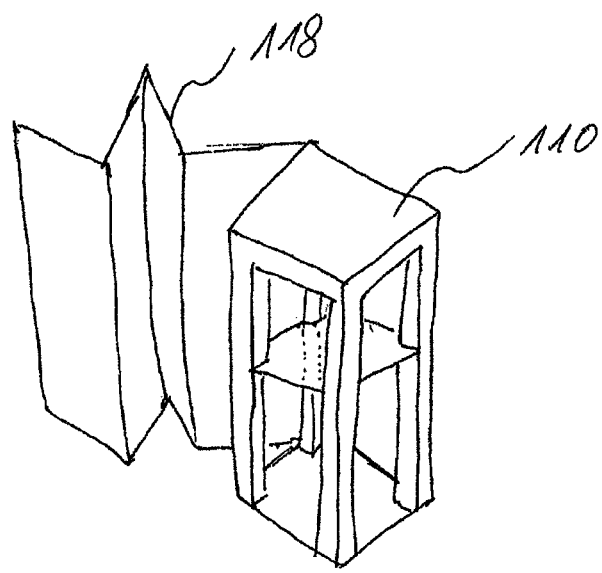
FIG. 6 shows an illustration of a device for a system for traffic monitoring with folding doors according to an exemplary embodiment of the present invention.

FIG. 6 shows a device 100 for a system for traffic monitoring with folding doors 118 according to an exemplary embodiment of the present invention. The device 100 can be an exemplary embodiment of a device 100 for a system for traffic monitoring shown in FIG. 1 to FIG. 5. With the exemplary embodiment shown in FIG. 6, four door panels of a door 118 are joined in concertina fashion, so that the door 118 can fold. The stop of the door 118 shown in FIG. 6 is comparable to the exemplary embodiment described in FIG. 4. The stop for the door 118 is thus disposed on a lateral edge of the first mounting frame 110, wherein the lateral edge is perpendicular to the lateral surface of the first mounting frame 110 facing the second mounting frame 112.

The exemplary embodiments described and shown in the figures are only selected by way of example. Different exemplary embodiments can be combined with each other fully or in relation to individual features. In addition, one exemplary embodiment can be extended by features of another exemplary embodiment.

Furthermore, steps of the method according to the invention can be carried out repeatedly and in a different sequence to that described.

If an exemplary embodiment comprises an "and/or" combination between a first feature and a second feature, this means that according to an embodiment the exemplary embodiment comprises both the first feature and also the second feature, and according to a further embodiment the exemplary embodiment comprises either only the first feature or only the second feature.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device for a system for traffic monitoring of vehicles in road traffic, the device comprising:
   a first mounting frame; and
   a second mounting frame that is securable or secured relative to the first mounting frame by inner fixing elements, wherein the second mounting frame is fixed to a base plate mounted on a measurement station, and the base plate is oriented in relation to the measurement station within a tolerance range, wherein the second mounting frame is mounted on the base plate rotated by a whole number multiple of 90° within a tolerance range, or is rotatable by 90° or 180° or 270° within a tolerance range,
   wherein at least the first mounting frame has a cylindrical or cuboidal, shape, wherein at least one device for recording a traffic situation is adapted to be disposed in the first mounting frame, and
   wherein at least the first mounting frame is accessible from four sides.

2. The device as claimed in claim 1, wherein at least one housing is fitted with at least one door, and wherein the first and/or second mounting frame is adapted to be disposed in the housing.

3. The device as claimed in claim 2, wherein the housing comprises at least one hinged door.

4. The device as claimed in claim 2, wherein the first mounting frame comprises a first housing and the second mounting frame comprises a second housing that is different from the first housing.

5. The device as claimed in claim 2, wherein the housing comprises at least one window on each of three sides of the housing, and wherein the device for recording comprises at least one sub-element that is designed for sending or receiving electromagnetic radiation through the at least one window.

6. The device as claimed in claim 2, wherein the housing has a specific protection class that is specified by a predetermined choice of a material of the housing.

7. The device as claimed in claim 2, wherein the housing is bulletproof.

8. The device as claimed in claim 1, wherein the second mounting frame is designed as an autonomous energy supply unit or an autonomous energy supply unit is arranged in the second mounting frame.

9. The device as claimed in claim 2, wherein the housing comprises two doors disposed against a lateral edge of the first mounting frame.

10. The device as claimed in claim 2, wherein the housing comprises two doors disposed against a diagonal edge on an end face of the first mounting frame facing away from the second mounting frame.

11. The device as claimed in claim 2, wherein the door of the housing is disposed on the lateral edge of the first mounting frame, wherein the lateral edge is perpendicular to the lateral surface of the first mounting frame facing the second mounting frame, and wherein the door comprises four panels that are joined in concertina fashion, so that the door can fold.

* * * * *